US006754871B1

(12) United States Patent
Pines et al.

(10) Patent No.: US 6,754,871 B1
(45) Date of Patent: Jun. 22, 2004

(54) METHOD AND APPARATUS FOR USING FIRE DECODER TO CORRECT BURST ERRORS IN A REAL-TIME COMMUNICATIONS SYSTEM

(75) Inventors: Howard Pines, El Cerrito, CA (US); Wenfeng Huang, San Ramon, CA (US); Daryl Kaiser, Los Gatos, CA (US); Ian Sayers, Redwood City, CA (US)

(73) Assignee: Cisco Technology, Inc., San Jose, CA (US)

( * ) Notice: Subject to any disclaimer, the term of this patent is extended or adjusted under 35 U.S.C. 154(b) by 488 days.

(21) Appl. No.: 09/919,761

(22) Filed: Jul. 31, 2001

(51) Int. Cl.[7] .............................................. H03M 13/00
(52) U.S. Cl. ...................................... 714/762; 714/761
(58) Field of Search ................................ 714/762, 746, 714/758, 781, 785, 761

(56) References Cited

U.S. PATENT DOCUMENTS

| 5,377,208 A | * | 12/1994 | Schneider-Obermann et al. ........................... 714/761 |
| 5,381,423 A | * | 1/1995 | Turco .......................... 714/762 |
| 5,657,331 A | * | 8/1997 | Metzner et al. ............. 714/762 |
| 5,936,978 A | | 8/1999 | Ramesh et al. ............ 371/39.1 |

OTHER PUBLICATIONS

Chien, R.T., "Burst Correcting Codes with High–Speed Decoding," *IEEE Transactions on Information Theory*, IT(15), Issue 1, pp. 109–113, 1969.

Lin,S. and Costello, D.J., "Burst–Error Correcting Codes," In Error Control Coding: Fundamentals and Applications, Franklin F. Kuo, Ed., (NJ: Prentice–Hall Series in Computer Applications in Electrical Engineering, pp. 257–271, (1983).

Draft EN300909 v6.2.0. (Apr. 1999) European Telecommunications Series, Digital cellular telecommunications system, (GSM 05.03 version 6.2.0 Release 1997) Oct. 1998.

Peterson, W.W. and Weldon, E.J., Jr., Error–Correcting Codes, Second Edition, MIT Press, Cambridge, MA, 1961.

* cited by examiner

*Primary Examiner*—Phung M. Chung
(74) *Attorney, Agent, or Firm*—Hamilton, Brook, Smith & Reynolds, P.C.

(57) ABSTRACT

Error bursts are detected and corrected in a communication system using shortened cyclic codes, such as shortened Fire codes. Data is loaded into a first error syndrome register and a second error syndrome register. The data in the registers may be evaluated to determine if the data bits contain a correctable error. Shortened zero bits are shifted into the second error syndrome register. A number of zero bits are shifted into the first error syndrome register to trap an error burst pattern in the data. A determination is made as to the number of zero bits shifted into the second error syndrome register to trap the location of the error burst in the data. Using the number of zero bits shifted into the second error syndrome register and the error burst pattern, the error in the data is located and corrected.

56 Claims, 8 Drawing Sheets

METHOD AND APPARATUS FOR USING FIRE DECODER TO CORRECT BURST ERRORS IN A REAL-TIME COMMUNICATIONS SYSTEM

BACKGROUND OF THE INVENTION

1. Technical Field of the Invention

The present invention relates generally to the field of data communications error correction and, in particular, to a method and apparatus for decoding shortened cyclic codes using error trapping.

2. Description of Related Art

In a (wireless) communications system, control signaling information is encoded and transmitted using control channel messages.

One specific wireless standard specification in widespread use is the Global System Mobile (GSM) specification. GSM defines a number of control channel messages, including: FACCH, SACCH, SDCCH, AGCH, PCH, and BCCH. These 184-bit control channel messages are encoded with 40 parity check-bits, which are generated by a shortened binary cyclic block code belonging to, for example, the family of so-called Fire codes. These codes are defined in ETS 300909 (GSM 05.03 version 5.5.1): October 1998—using the generator polynomial:

$$G(X)=(X^{23}+1)*(X^{17}+X^3+1).$$

The large number of parity check-bits virtually guarantees that a noise-corrupted signaling message will be detected and discarded by the base station.

The 40 parity check-bits generated by the Fire code can also be used to correct a single burst error up to 12 bits in length. Since signaling messages are interleaved over 4 or 8 bursts, the Fire code decoder could effectively correct error bursts of length 48 to 96 bits occurring in the air channel due to the diverse effects of signal interference. Since the 456 bits of a convolutionally encoded message are convolutionally decoded after deinterleaving and before the Fire code decoding procedure, a statistically significant percentage of signaling messages subject to error bursts can be completely recovered by the Fire code decoding procedure.

The error burst correction procedure is more than two orders of magnitude more computationally complex than the procedure for error detection. See (i) W. W. Peterson, *Error-Correcting Codes*, MIT Press, Cambridge, Mass., 1961 and (ii) R. T. Chien, "Burst-Correction Codes with High-Speed Decoding," EEEE Transactions on Information Theory, IT(15), Issue 1, pp. 109–113, January 1969. Implementation of the Fire code decoder in real-time, therefore, has not been considered practical in consideration of other base transceiver stations (BTS) uplink burst processing requirements, such as demodulation, equalization, and convolutional error decoding.

The generator polynomial of a Fire code is expressed as the product of two polynomials $G(x)=(x^{2t-1}-1)*p(x)$, where the polynomial $p(x)$ is characterized by a periodicity factor $r_0$. A code using $G(x)$ is able to correct any single burst error less than or equal to 't' bits long.

Fire codes are represented by the notation F[n,k], where n is the number of coded bits, k is the length of the data to be coded, and (n–k) is the number of parity-check bits. The code can be shortened in length for a specific coding application by subtracting b bits from both the information word and its related code word to obtain the Fire Code F[N,K]=F[n–b,k–b].

In all of the following, for illustrative purposes, we shall refer to the case of the generator polynomial of the shortened Fire code F[224,184] specified in the aforementioned ETSI/GSM Standard, $G(X)=(X^{23}-1)*(X^{17}+X^3+1)$, which can correct a single burst error up to t=12 bits long. The polynomial $(X^{17}+X^3+1)$ has a periodicity factor $r_0=(2^{17}-1)=131,071$.

A cyclic code (e.g., Fire code) decoder error correction procedure is based on a fast error-trapping decoder for Fire codes first taught by Peterson and refined by Chien (see citations above). There, the error-trapping decoder includes two error syndrome shift registers: an error-pattern register and an error location register. The error-pattern register is based on the factor $(X^{23}+1)$ of the generator polynomial $G(X)=(X^{23}+1)*(X^{17}+X^3+1)$, and the error-location register is based on the factor $(X^{17}+X^3+1)$.

In the Chien method, the data is first shifted into both registers. If an error is detected and determined to be correctable, the error correction procedure consists of the following steps:

1. Compute the number of '0' bits to be shifted into the first error syndrome register, the error-pattern register, until the burst error pattern is trapped in the 't' low order stages of this register. The number of required shifts is computed to be $\lambda_1$.
2. Compute the number of '0' bits to be shifted into the second error syndrome register, the error-location register, until the contents in the 't' low-order stages matches the burst error pattern trapped in step 1. The number of required shifts is computed to be $\lambda_2$.
3. Use $\lambda_1$ and $\lambda_2$ as inputs to a set of equations described in R. T. Chien, "Burst-Correction Codes with High-Speed Decoding," IEEE Transactions on Information Theory, IT(15), Issue 1, pp. 109–113, January 1969 and U.S. Pat. No. 5,381,423 by E. Turco, Issued on Jan. 10, 1995 ("Turco") to compute the location of the burst error in the original data.
4. Use the error pattern trapped in step 1 to correct the burst error beginning at the location computed in step 3.

However, the Peterson and Chien fast trapping decoder does not explicitly address the requirements for dealing with a shortened Fire code. The GSM Fire code has been shortened to N=224 bits in length (i.e., K=184 bit control channel message plus 40 parity bits). The original length of the code corresponds to $G(X)=(X^{23}+1)*(X^{17}+X^3+1)$ is $n=23*(2^{17}-1)=3,014,633$ bits. See S. Lin, D. J. Costello, Jr., *Error Control Coding: Fundamentals and Applications*, p. 261, Prentice-Hall Publishing, Englewood Cliffs, N.J., 1983. Thus, the code has been shortened by 3,014,633–224=3,014,409 bits. In order for a shortened cyclic code decoder's syndrome registers to be properly initialized, in addition to shifting-in the data and parity bits, it is also necessary to shift in an additional number of '0' bits equal to the number of shortened bits. This would require an additional 3,014,409 '0' bits to be shifted into the syndrome registers.

Turco addresses the issue of shifting in the large number of '0' bits by teaching that it is not necessary to shift the shortened zero ('0') bits into both the error-location and error-pattern registers. Instead, the shortened zero bits are only shifted into the error-location register. The number of zero bits to be shifted is equal to $(r_0-N+1)=130,848$ bits.

Once the error burst pattern and location have been identified, Peterson, Chien, and Turco solve a set of equations, as described above in step 3, to locate where the error burst resides in the original data.

SUMMARY OF THE INVENTION

In the present invention, it is not necessary to perform step 3 in the error correction procedure proposed by (i) W. W.

Peterson, *Error-Correcting Codes*, MIT Press, Cambridge, Mass., 1961 and (ii) R. T. Chien, "Burst-Correction Codes with High-Speed Decoding," WEEE Transactions on Information Theory, IT(15), Issue 1, pp. 109–113, January 1969 and described by Turco in U.S. Pat. No. 5,381,423, issued Jan. 10, 1995. Nor is it necessary to use the value corresponding to $\lambda_1$ in the Chien method to compute the location of the error burst. Rather, in the present invention, the location of the error burst is computed directly from the value $\lambda$, which corresponds to the value $\lambda_2$ in step 2 of the Chien procedure.

According to the principles of the present invention, a method and apparatus are used for correcting error bursts in a communication system using shortened cyclic codes, such as shortened Fire codes. Data is loaded into a first error syndrome register and a second error syndrome register. The data in the registers may be evaluated to determine if the data bits contain a correctable error. Shortened zero bits are shifted into the second error syndrome register. A number of zero bits are shifted into the first error syndrome register to trap an error burst pattern in the data. A determination is made as to the number of zero bit shifts, $\lambda$, into the second error syndrome register to trap the error burst location in the data. Using the value $(\lambda-c)$, where 'c' is a constant, and the error burst pattern, the error in the data is located and corrected.

The first error syndrome register may be referred to as an error pattern register, and the second error syndrome register may be referred to as an error location register. The number of shortened zero bits shifted into the second error syndrome register is $(r_0-N+1)$, which is based upon (i) the periodicity $r_0$ of the smaller factor composing the cyclic code corresponding to the error location register and (ii) the length N of the shortened cyclic code. Typically, trapping the error burst pattern uses no more than $(2t-2)$ shifts. Also, trapping the error burst location uses no more than $(N+c)$ shift and compare operations. For TDMA-based GSM systems, the trappings require no more than 22 shifts and 237 shift and compare operations, respectively.

A signal processor may be employed to execute software implementing the decoder. Shifting the shortened zero bits and the other zero bits may be implemented in a manner that exploits the architecture of the signal processor. For example, logical operations AND, XOR and SHIFT, and arithmetic operation, MULTIPLY, may be combined to take advantage of the efficient pipeline process provided by the signal processor. In such an embodiment, a shift operation is executed in a single signal processor instruction cycle.

A system employing the cyclic code decoder may be used in a TDMA-based GSM system. In the case of using a signal processor to implement the processes described herein, the signal processor resources available during inactive time slots of the TDMA-based GSM system are utilized in a background mode to process the shifting-in of the shortened data zeros. In one embodiment, processing is distributed over a variable number of inactive radio channel time slots in order to provide enough signal processor resources to correct a frame of data while minimizing frame-buffering delays.

In a system employing the teachings described herein, error bursts are capable of being detected and corrected in real-time.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF A PREFERRED EMBODIMENT

The following detailed description of the preferred embodiment, including the information depicted in FIGS. 3,4,5,6, references the specific case of the GSM/ETSI Fire coded polynomial. This is for illustrative purposes only and in no way limits the generality of the procedure described in the current invention.

Figure 1:
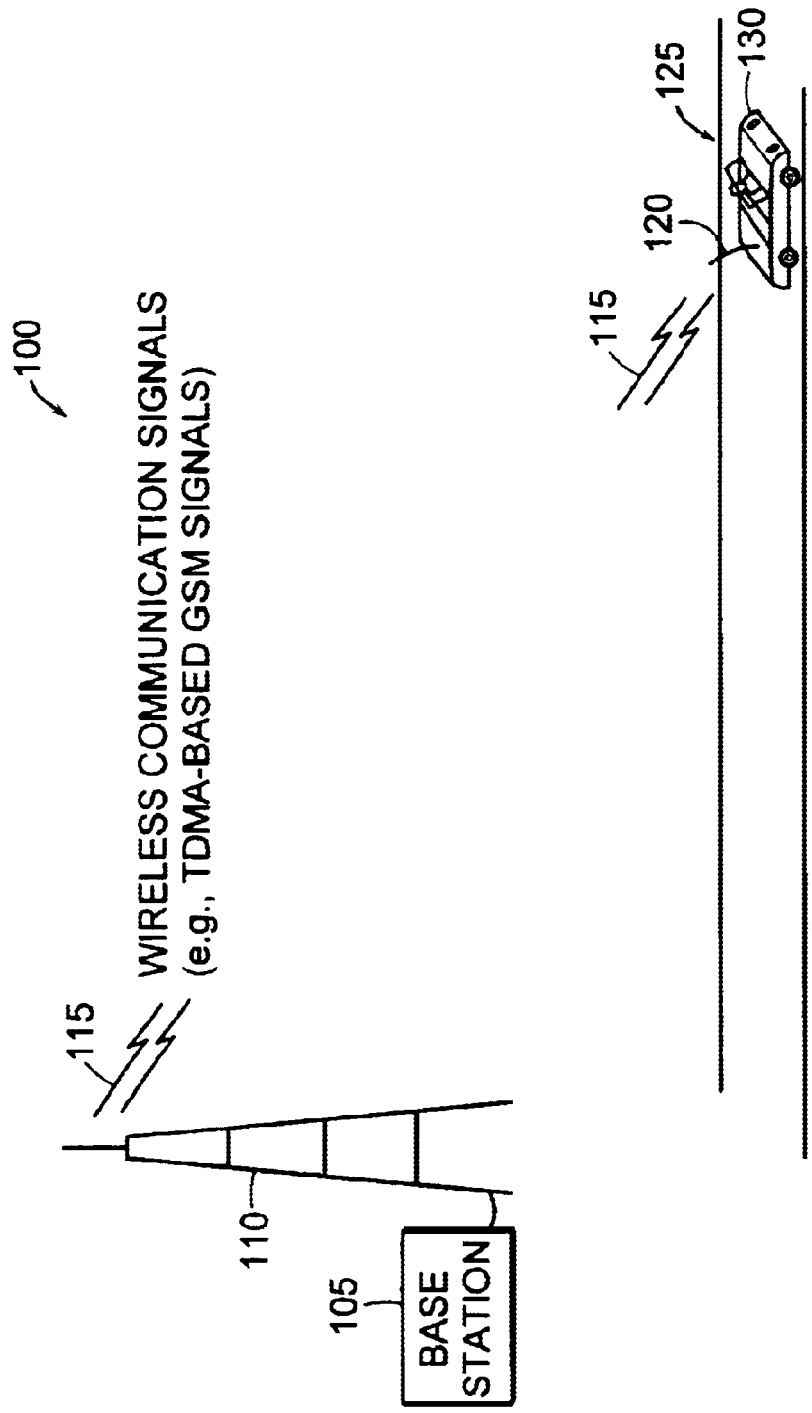
FIG. 1 is a block diagram of a wireless communications system having a base station and subscriber unit, in both of which the principles of the present invention may be employed.

FIG. 1 is a diagram of an environment having a wireless communications system 100. The wireless communications system 100 includes a base station 105 connected to an antenna tower 110 used to transmit and receive wireless communications signals 115 for the base station in a typical manner. The wireless communications signals 115 are received and transmitted by an antenna 120 coupled to a subscriber unit 125 in an automobile 130 when communicating with the base station 105.

The wireless communications signals 115 may be Time Division Multiple Access (TDMA) based GSM signals. As is common in the art, transmission of the wireless communications signals 115 invariably results in communications errors, manifested in digital bit error bursts in the signal. To correct these error bursts, cyclic codes, such as Fire codes, have been used to determine that an error burst is present in the received data. The processing required to determine that an error burst has occurred has been sufficient to determine that the error burst has occurred, but not sufficient both to detect the error burst and to correct the error burst, even though cyclic codes and shortened cyclic codes allow for detection and correction.

There has been work conducted in the area of reducing the processing requirements of cyclic codes, including Fire codes. For example, an error-trapping Fire decoder has been developed by Peterson and Chien, as described in S. Lin, D. J. Costello, Jr., *Error Control Coding: Fundamentals and Applications*, pp. 261–271, Prentice-Hall Publishing, Englewood Cliffs, N.J., 1983 ("Lin & Costello"). The Fire code solution described in Lin & Costello facilitates correction of error bursts through the use of non-shortened Fire codes; however, as described in the teachings of U.S. Pat. No. 5,381,423 by E. Turco, Issued on Jan. 10, 1995, it does not further allow correction of these detected error bursts through the use of shortened Fire codes in real-time. The solution described in Lin & Costello is extended herein, allowing both detection and correction of transmission error bursts in the wireless communications system 100 in real-time through the use of shortened cyclic codes.

The solution lends itself well to the pipeline processing used by digital signal processors for further optimization to ensure the real-time detection and correction of the error bursts.

Figure 2:
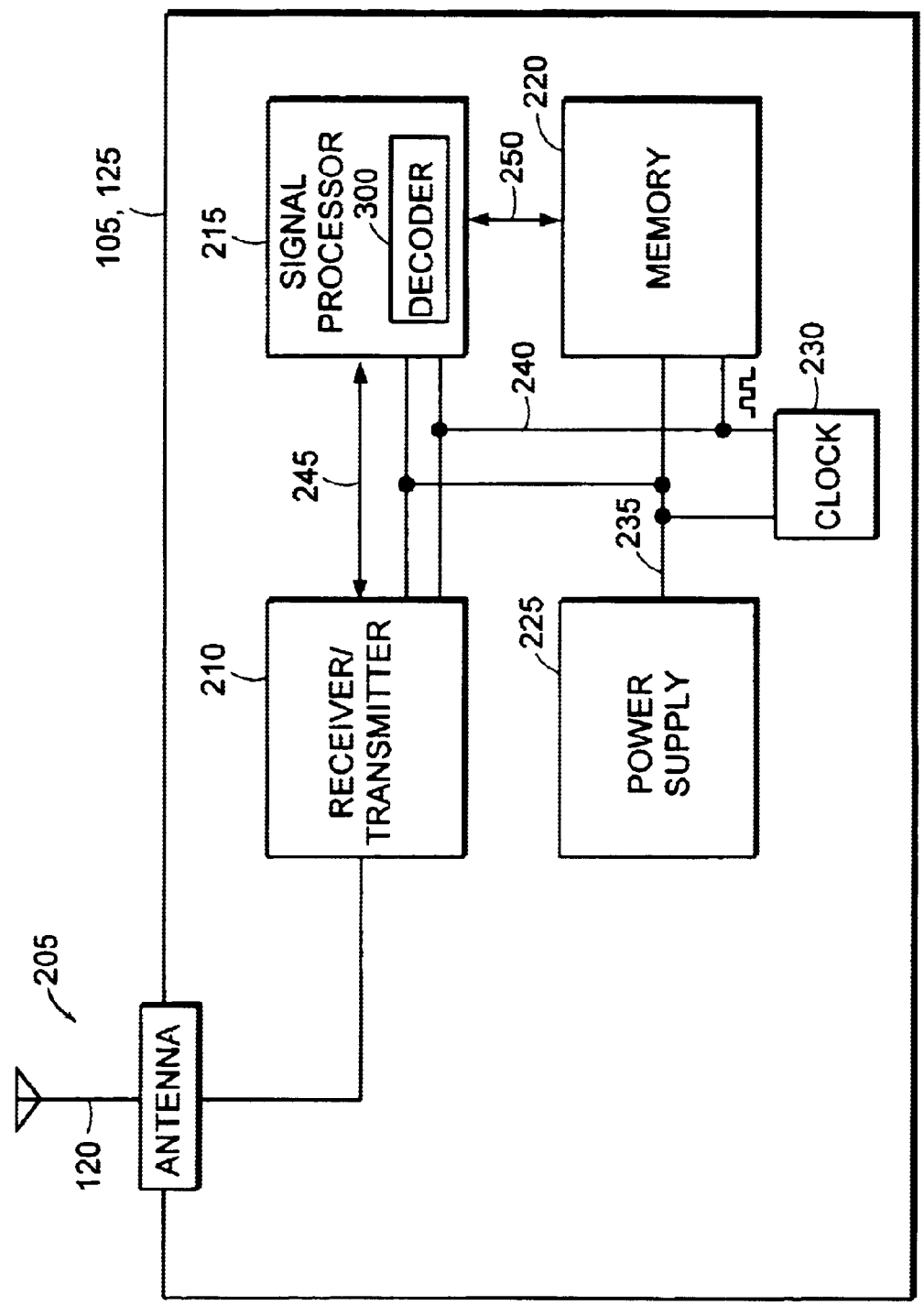
FIG. 2 is a generalized block diagram of a communications subsystem used in the wireless communications system of FIG. 1.

FIG. 2 is a generalized block diagram of both a base station 105 and subscriber unit 125. For the purposes of this discussion, this block diagram will be described in reference to the subscriber unit 125 and a specific, shortened cyclic code, namely the shortened Fire code. The system can be implemented in the base station 105 in a similar manner as described below in reference to the subscriber unit 125.

The subscriber unit 125 includes an antenna assembly 205, which includes the antenna 120. The subscriber unit 125 further includes a receiver/transmitter 210, signal processor 215 executing a shortened cyclic code decoder 300, power supply 225, memory 220, and clock 230. The power supply 225 provides power to the other subassemblies 210, 215, 220, and 230 over a power bus 235. The clock 230 provides a clock signal over a clock bus 240. Baseband signals are transferred between the receiver/transmitter unit 210 and signal processor 215 via a data bus 245. Data shared between the signal processor 215 and memory 220 are shared via memory data bus 250.

In operation, the subscriber unit 125 transmits and receives RF signals carrying data encoded with shortened Fire codes via the antenna assembly 205. The receiver/transmitter unit 210 provides a conversion from baseband data signals to RF signals, as is common in the art. Among other tasks, the signal processor 215 provides processing for the decoder 300, related to the shortened Fire codes, for detecting and correcting error bursts found in the received signal resulting from wireless transmission of the signal between the base station 105 and subscriber unit 125.

The signal processor 215 may have enough on-board memory for supporting the shortened Fire code detection and correction process. Alternatively, the signal processor 215 may employ the memory 220 to support this process. It should be understood that, because the processing of the shortened Fire codes is desired to be done in real-time, the memory 220 is a high-speed memory device, causing minimal data latencies for the signal processor 215. Further, the signal processor 215 may be a digital signal processor, such as a Texas Instruments® TMS320C6X family processor, optimized for selected pipelining processes.

It should be understood that the fast-trapping, shortened Fire code decoder implemented in the signal processor 215 of the subscriber unit 125 is also suitable for implementation in other forms of wireless communication equipment, such as wireless telephones, personal digital assistants (PDAs), text pagers, and so on. Further, the shortened Fire code decoder may be implemented in other forms of processors, including hardware, firmware, and application specific integrated circuits (ASICs). Additionally, the Fire code decoder may be optimized for parallel processing for systems having multiple signal processors 215 operating in a parallel manner.

Figure 3:
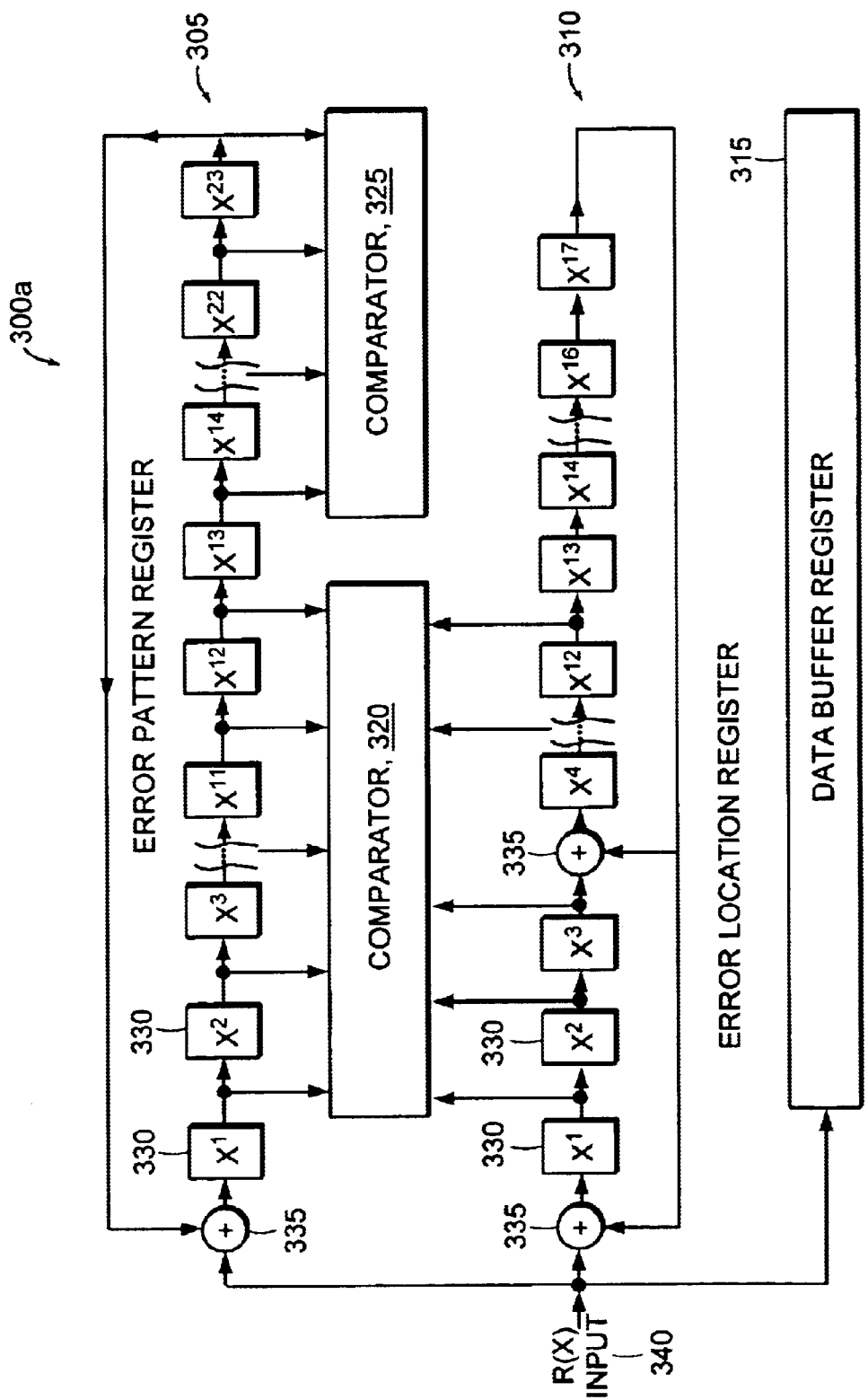
FIG. 3 is a block diagram of a first state of a high-speed, error-trapping, cyclic code decoder implemented in a signal processor in the subsystem of FIG. 2.

FIG. 3 is a block diagram depicting a first state of the fast-trapping shortened Fire code decoder 300. The decoder 300 includes a first error syndrome register ($s_1$) 305, referred to as an error pattern register 305, and a second error syndrome register ($S_2$) 310, referred to as an error location register 310. The decoder 300 also includes a data register buffer 315, in which data received by the decoder 300 is stored temporarily while the data is tested for a presence of an error burst.

The decoder 300 further includes comparators 320 and 325 logically disposed between the error pattern register 305 and error location register 310. The registers 305, 310 are composed of a plurality of bit storage locations 330 and XOR logic functions 335.

The first part of the shortened Fire code decoder procedure includes shifting-in the data. As shown in FIG. 3, the received input data R(x) 340, consisting of the 184 data and 40 parity bits (224 bits total) for a shortened Fire coded signal, is shifted into both of the error syndrome registers 305, 310 and the data buffer register 315 in a parallel manner. If the contents of the registers, $s_1(X)=s_2(X)=0$, as determined by comparators 320 and 325, then the received data 340 is error-free, and no correction is necessary. If $s_1(X) \neq 0$ and $s_2(X) \neq 0$, the received data 340 contains a correctable error, and the process continues to the next step. Otherwise, the received data 340 contains a detectable but uncorrectable error, and the received data 340 is discarded.

Because the decoder 300 is directed to working with shortened Fire codes, the only way to detect an uncorrectable error is when the length of the non-zero section of the error pattern register 305 is greater than 12 bits. Thus, the comparators 320 and 325 are logically connected to the storage locations 330 of the error pattern register 305 to make that determination.

Figure 4:
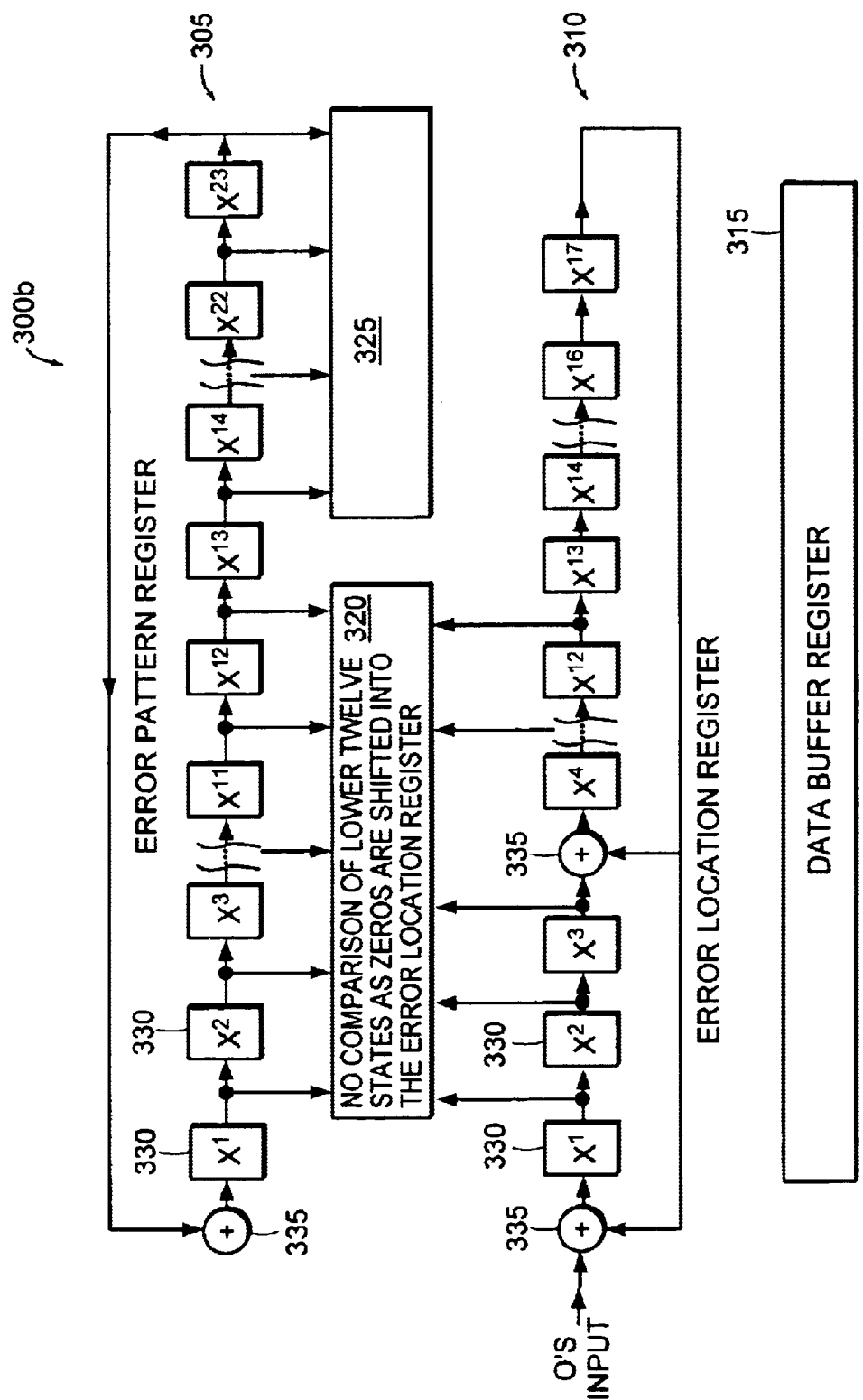
FIG. 4 is a block diagram of a second state of the decoder of FIG. 3.

Following the shifting-in (i.e., loading) of the received data 340 into the shift registers 305, 310, the data buffer register 315, and, optionally, if the decoder 300 determines that the received data 340 contains a correctable error burst, then the error burst detection and correction process executed by the decoder 300 continues by shifting-in shortened zero bits, which is shown in FIG. 4.

Referring now to FIG. 4, a second state of the decoder 300, corresponding to a second step in the real-time error burst detection and correction process, includes the same basic structural elements as the first state of the decoder 300, including the error pattern register 305, error location register 310, data register buffer 315, and comparators 320, 325.

For proper initialization of the error syndrome registers 305, 310 for the shortened Fire code, an additional ($r_0$−N+ 1)=130,848 'shortened' zero ('0') bits are shifted into the error location register 310. During the "shifting-in" of the zero bits into the error location register 310, the first comparator 320 does not compare the lower 12 states of the registers 305, 310.

The shifting-in of each zero bit requires three logical operations, AND, XOR, and SHIFT, and one arithmetic operation, MULTIPLY. The shifting of the shortened zero bits thus requires a total of (4*130,848)=523,392 operations. To reduce the instruction cycles by the signal processor 215 (FIG. 2) required to process the shifting-in operation and to ensure further the Fire decoder error correction process is achievable in real-time, the shifting-in operation can be optimized as follows:

1. The four operations, AND, XOR, SHIFT, and MULTIPLY are grouped together to exploit the architecture of the signal processor 215, which executes multiple instructions per instruction cycle. In this way, the four operations are executed in a single instruction cycle. In other words, the instructions have been optimized to take advantage of a pipelining process that is optimized in the architecture of the signal processor 215.

2. The signal processor 215 resources available during inactive time slots in a TDMA-based GSM system are utilized in "background mode" to process the shifting-in of the shortened zero bits. This processing can be distributed over a variable number of inactive radio channel time slots in order to provide enough signal processor 215 resources to correct a frame of data while minimizing frame-buffering delays.

Figure 5:
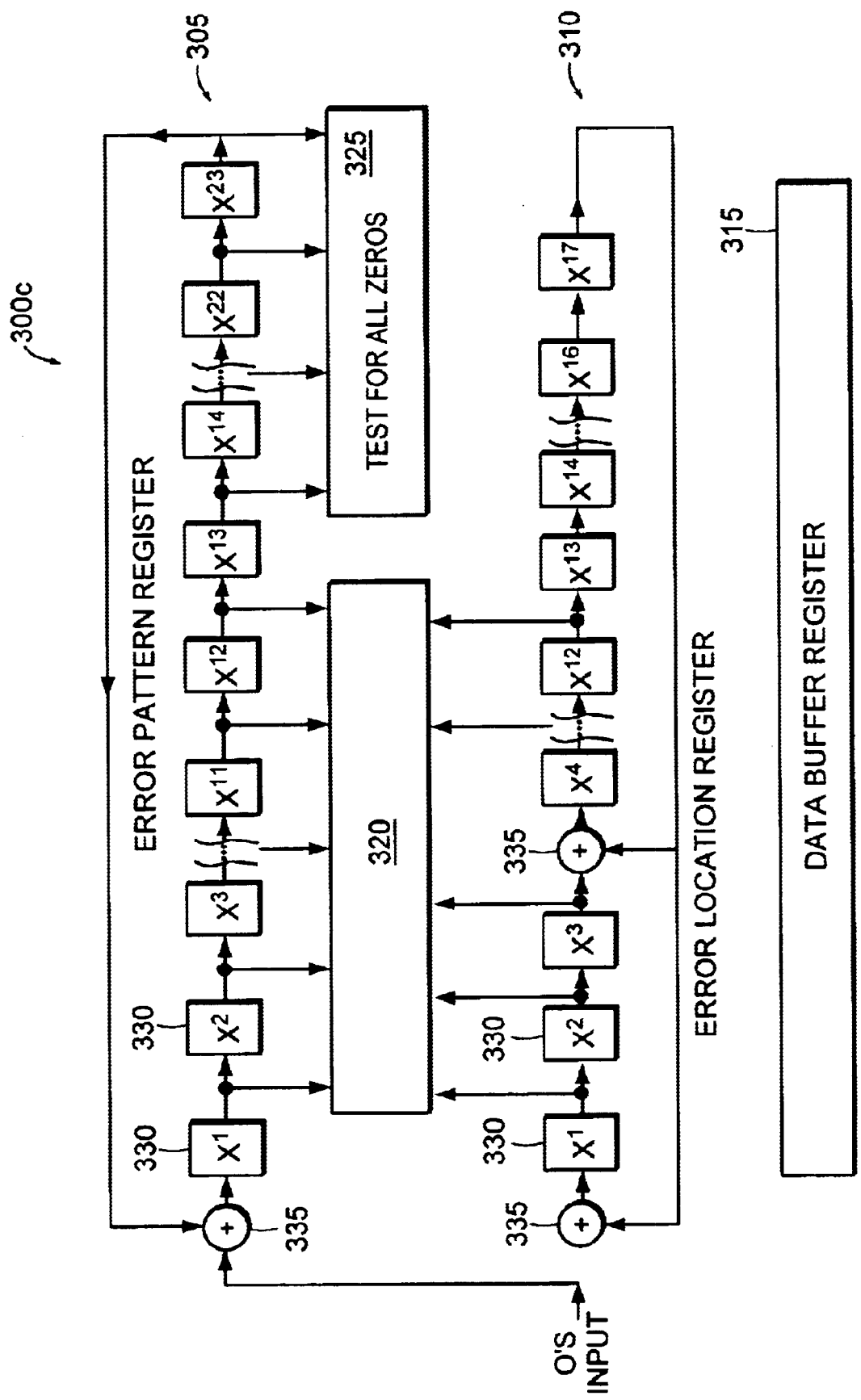
FIG. 5 is a block diagram of a third state of the decoder of FIG. 3.

FIG. 5 is a block diagram of a third state of the decoder 300 during the third step in the process of decoding and correcting error bursts in real-time. As shown in FIG. 5, '0' bits are shifted into the error pattern register 305 until the (t−1)=11 high-order stages contain all zeros. The 11 high-order stages are $X^{13}$–$X^{23}$. The error burst is then trapped in the t=12 low-order stages (i.e., $X^1$–$X^{12}$) of the error pattern register 305. As explained in Lin & Costello at pp. 262–266, incorporated herein by reference, no more than (2t−2) shifts are needed to trap the error burst.

Figure 6:
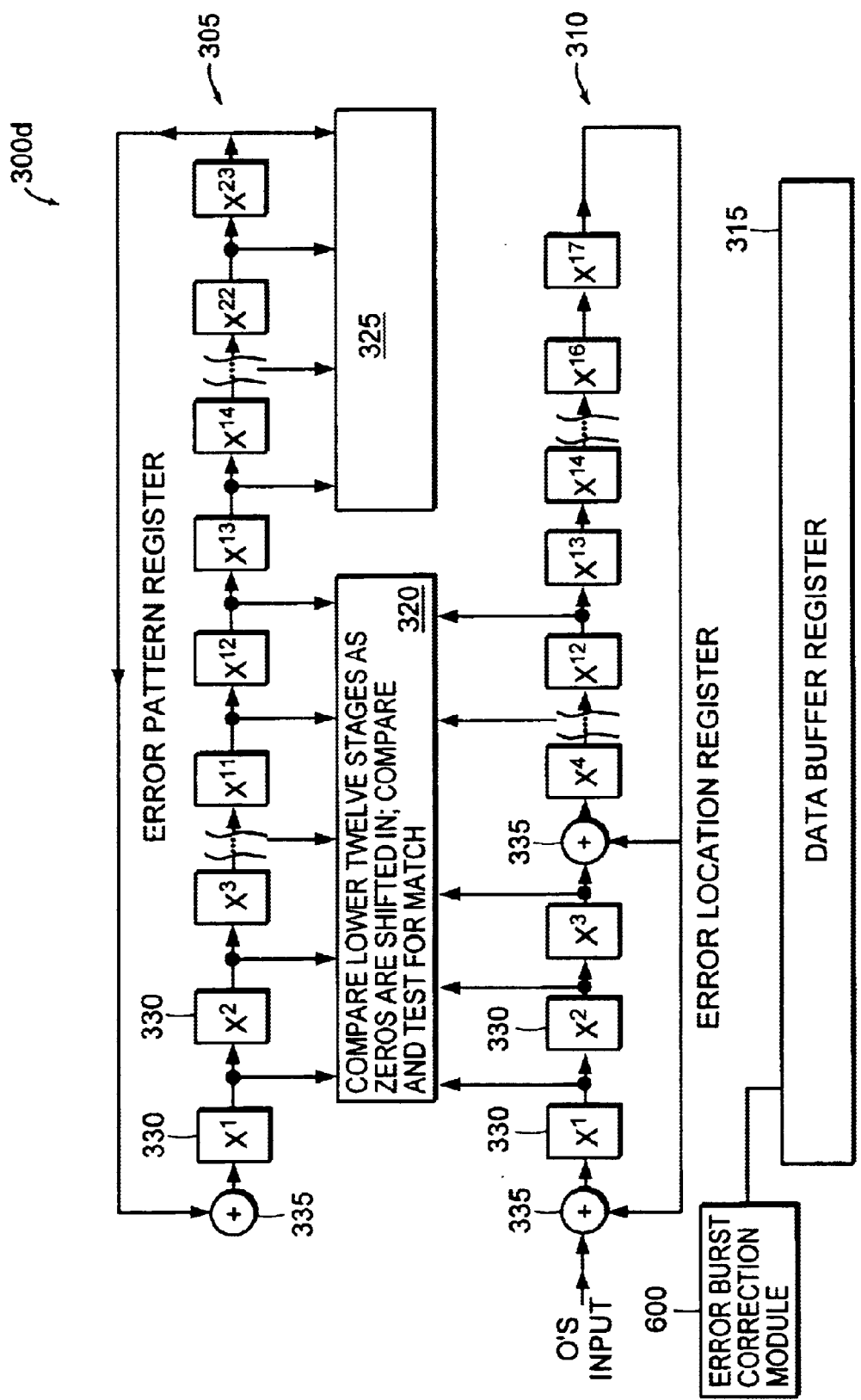
FIG. 6 is a block diagram of a fourth state of the decoder of FIG. 3.

FIG. 6 is a block diagram of a fourth state of the decoder 300 corresponding to the fourth step in the real-time detection and correction process. As shown, '0' bits are shifted into the error location register 310 until the contents in its 12 low-order stages match the burst pattern in the 12 low-order stages of the error pattern register 305. The first comparator 320 supports this matching process. Let λ equal the number of shifts needed to trap the error burst location. Because a shortened fire code is being used, no more than (N+c) shift and compare operations are needed to trap the error burst.

Following this fourth step in the detection and correction process, the decoder 300 employs an error burst correction module 600 to execute the last step in the process, which is to correct the detected error burst in the data. Using (λ−c), where 'c' is a constant, and the burst pattern in the 12 low-order stages of the error location register 305, the module 600 locates and corrects the 12 bit error burst in the data in the data buffer register 315. This correction process is described in Lin & Costello at pp. 265–266. In part, the error burst pattern trapped in the error pattern register 305 is XOR'ed with the received data 340 in the data register buffer 315, beginning at a bit in the received data 340 located as a function of (λ−c). Thus, burst correction module 600 is much simpler than solving the set of equations in the Chien method as described by Turco.

Figure 7:
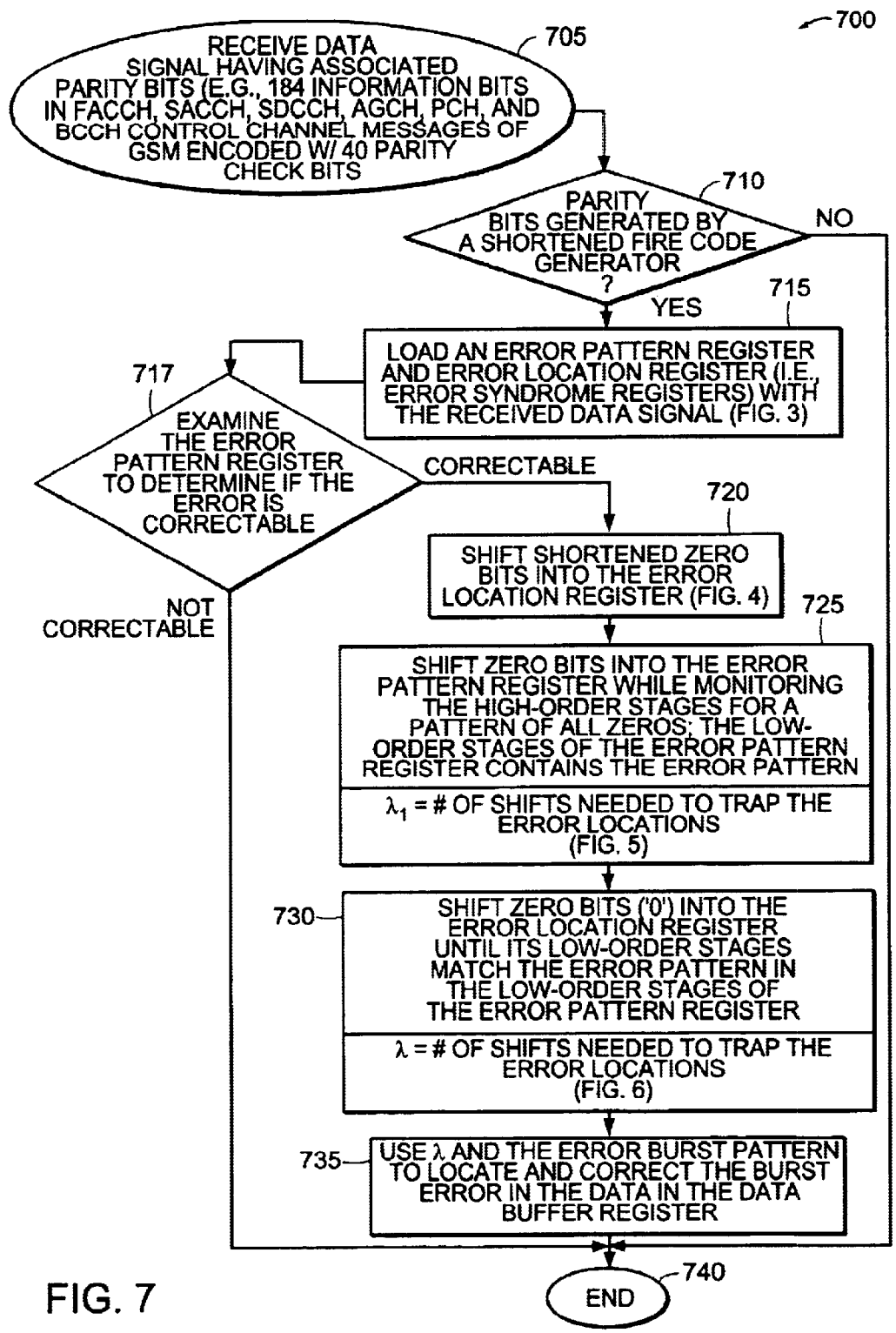
FIG. 7 is a flow diagram of an embodiment of process used by the decoder of FIGS. 3–6.

FIG. 7 is a flow diagram of the process described in reference to the detector 300 of FIGS. 3–6. The process 700 begins in step 705. In step 705 data signals having associated parity bits are received by the subscriber unit 125. Examples of such data signals are 184 information bits in FACCH, SACCH, SDCCH, AGCH, PCH, and BCCH control channel messages of GSM encoded with 40 parity bits, for a total of 224 bits. In step 710, the process determines whether the parity bits have been generated by a shortened Fire code generator. This check is done to ensure backward compatibility with existing systems. If the parity bits were generated, for example, by a non-shortened Fire code generator, then the process ends in step 740. If the parity bits have been generated by a shortened Fire code generator, then, the process 700 continues in step 715.

In step 715, the process loads the error pattern register 305 and error location register 310 (i.e., error syndrome registers) with the received data signal 340. This step is executed by the decoder 300 in FIG. 3. In step 717, the error pattern register is tested to determine if an error exists and is correctable.

In step 720, the process 700 shifts shortened zero bits into the error location register 310, as described in reference to FIG. 4.

In step 725, the process 700 shifts zero ('0') bits into the error pattern register 305 until high-order stages contain a pattern of all zeros. The low-order stages of the error pattern register 305 contains the error pattern. Step 725 is described in more detail above, in reference to FIG. 5.

In step 730, the process 700 shifts zero ('0') bits into the error location register 310 until its low-order stages match the error pattern in the low-order stages of the error pattern register 305. A counter, λ, stores the number of shifts needed to trap the error burst location in the received data 340. This process, step 730, is described in more detail above, in reference to FIG. 6.

The process 700 continues in step 735, in which λ and the error burst pattern are used by a module (not shown) in the decoder to locate and correct the error burst in the received data 340 stored in the data register buffer 315. This process, step 735, is described above in reference to FIG. 6. The process 700 ends in step 740.

Figure 8:
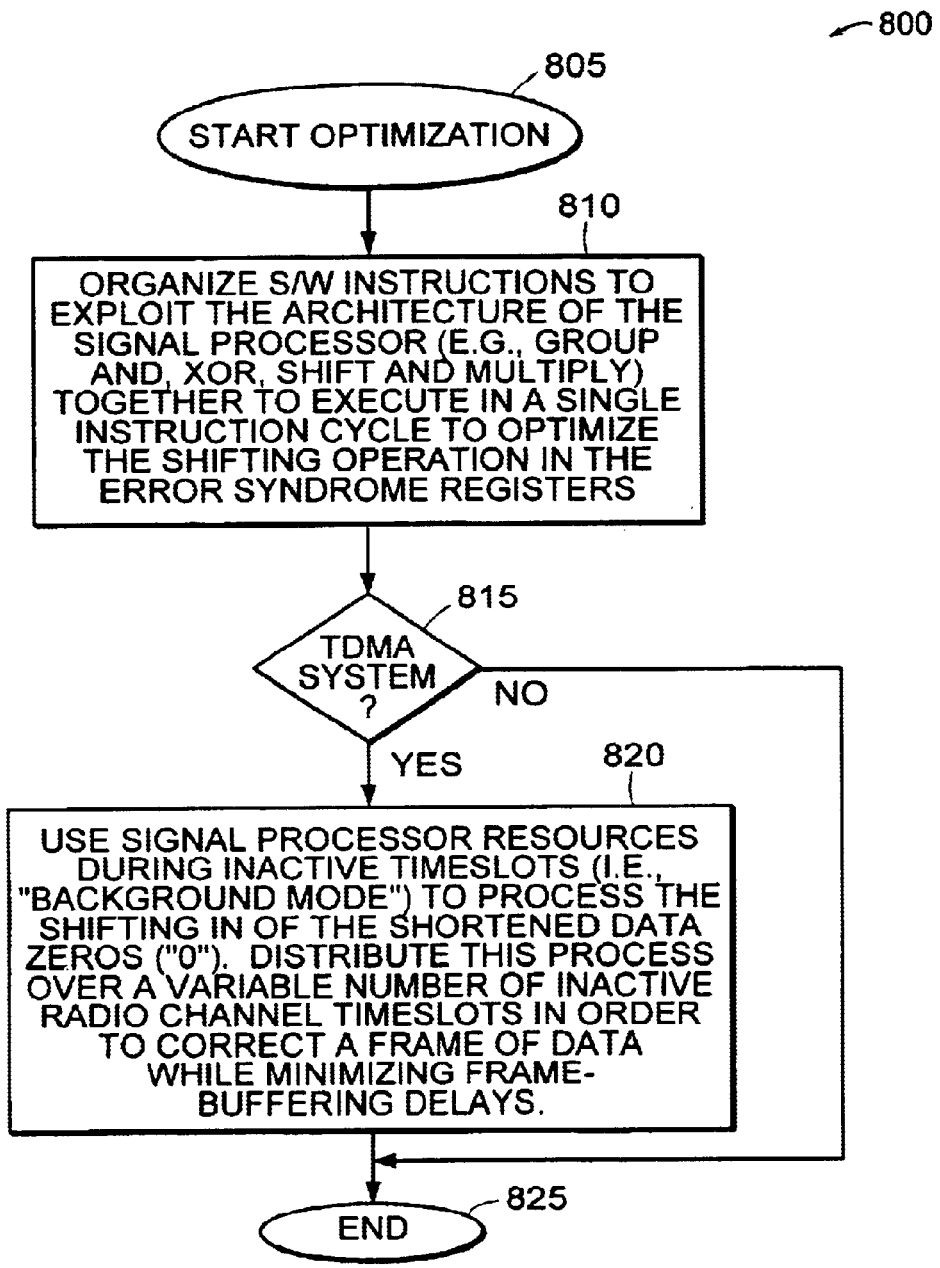
FIG. 8 is flow diagram of an embodiment of a process used to optimize the operation of the decoder in the signal processor of FIG. 2.

FIG. 8 is a flow diagram of an embodiment of a process 800 in which the processes described in reference to the decoder 300 of FIGS. 3–6 are optimized for execution by the signal processor 215 (FIG. 2). The process 800 begins in step 805. In step 810, the software instructions executed by the signal processor 215 are organized to exploit the architecture of the signal processor. For example, the shift operation executed by the error syndrome registers 305, include AND, XOR, SHIFT, and MULTIPLY to perform a single shift. These four instructions are grouped together to execute in a single instruction cycle to optimize the shifting operation in the error syndrome registers 305, 310.

In step 815, the process 800 determines if the decoder 300 is operating in a Time Division Multiple Access (TDMA) system. If the decoder 300 is operating in a TDMA system, then the process 800 continues in step 820. In step 820, the process 800 uses signal processor resources during inactive time slots (i.e., "background mode") to process the shifting-in of the shortened zeros bits. This process can be distributed over a variable number of inactive radio channel time slots in order to correct a frame of data, while minimizing frame-buffering delays. The process 800 ends in step 825.

As stated above, the processes executed by the decoder 300, including the optimization process 800, can be software executed by the signal processor 215 (FIG. 2). The software can be stored in the memory 220, which may include RAM, ROM, magnetic or optical disk, or other computer readable memory. The memory 220 may be local to the subscriber unit 125 (FIG. 2), or may be located remotely and transferred to the subscriber unit 125 via computer network, including via wireless data transmission. Once the decoder software is loaded into the signal processor 215, it is executed by the signal processor 215 on an as-needed basis.

While this invention has been particularly shown and described with references to preferred embodiments thereof, it will be understood by those skilled in the art that various changes in form and details may be made therein without departing from the scope of the invention encompassed by the appended claims.

For example, for code division multiple access (CDMA) systems, reduced resource usage may make processing resources available for cyclic code decoding, such as to shift in the shortened zero bits or other zero bits that are shifted into one of the error syndrome registers 305, 310, as described above.

The zero ('0') bits may be one '1' bits in a system having reverse-logic level true from the decoder 300 described above.

The two error syndrome registers 305, 310 may be subregisters in a single error syndrome register. The processing described above is then modified, as necessary, to support such a structure.

What is claimed is:

1. A method for correcting error bursts in a communication system using a shortened cyclic code, comprising:

loading data and parity bits into a first error syndrome register and a second error syndrome register;

shifting shortened zero bits into the second error syndrome register;

shifting a first set of zero bits into the first error syndrome register, until a predefined number of stages in the first error syndrome register contain a predefined data pattern, to trap an error burst having a burst pattern in a given subset of the stages composing the first error syndrome register;

(i) shifting a second set of zero bits into the second error syndrome register and (ii) comparing the burst pattern in the given subset of stages of the first error syndrome register and the data pattern in a corresponding subset of stages in the second error syndrome register until a match of the burst pattern is found; and based on (i) the number of zeros shifted into the second error syndrome register and (ii) the error burst pattern, locating and correcting the error burst pattern in the data.

2. The method as claimed in claim 1, wherein the shortened cyclic code is a shortened Fire code.

3. The method as claimed in claim 1, wherein the first error syndrome register is an error pattern register and the second error syndrome register is an error location register.

4. The method as claimed in claim 1, wherein the error burst is a single error burst b(k) of a length t or shorter, the cyclic code having a generator polynomial of type $G(x)=(x^{2t-1}+1) p(x)$, wherein p(x) is a prime polynomial over GF(2) with period $r_0$, satisfying $r_0>(n-b)$, when n equals a length of a binary code and b equals a number of shortened bits.

5. The method as claimed in claim 1, wherein the shortened number of zero bits is equal to $(r_0-N+1)$, where $r_0$ is the period of the second factor of the shortened cyclic code on which the second error syndrome register is based, and N is the length of the shortened cyclic code.

6. The method as claimed in claim 1, wherein trapping the error burst uses no more than (2t−2) shifts.

7. The method as claimed in claim 1, wherein trapping the error burst location uses no more than (N+c) shift and compare operations.

8. The method as claimed in claim 1, executed in a signal processor.

9. The method as claimed in claim 8, wherein shifting the zero bits exploits the architecture of the signal processor.

10. The method as claimed in claim 9, wherein a shift operation is executed in a single signal processor instruction cycle.

11. The method as claimed in claim 1, used in a TDMA-based GSM system.

12. The method as claimed in claim 11, executed in a signal processor, wherein the signal processor resources available during inactive time slots are utilized in a background mode to process the shifting-in of the shortened zero bits.

13. The method as claimed in claim 12, wherein processing by the signal processor is distributed over a variable number of inactive radio channel time slots in order to provide enough signal processor resources to correct a frame of data while minimizing frame buffering delays.

14. The method as claimed in claim 1, wherein the error bursts are detected and corrected in real-time.

15. An error trapping decoder for correcting error bursts in a communication system using shortened cyclic codes, comprising:

a first error syndrome shift register, having a structure based on a first factor of a given cyclic code of a given cyclic code family, and a second error syndrome shift register, having a structure based on a second factor of the given cyclic code, the shift registers shifting-in an input binary signal having associated parity check bits generated by a shortened binary cyclic block code belonging to the given cyclic code family;

a first comparator and a second comparator, coupled to the first and second error syndrome shift registers, receiving data bits stored in a predefined number of low-order and high-order stages of the shift registers, respectively;

a buffer receiving the input binary signal;

a correction module coupled to said comparators and said buffer;

said second error syndrome shift register shifting in a shortened number of zero bits after the shift registers have shifted-in the input binary signal;

said second comparator determining the number of shifts needed to trap the error burst by monitoring how many zero bits are shifted into said first error syndrome shift register before the data bits in the high-order stages of the shift register have a predetermined pattern indicating the error burst;

said first comparator determining the number of shifts needed to trap the error burst location, after the shortened number of zero bits are shifted-in, by monitoring how many zero bits are shifted into said second error syndrome shift register before the data bits in the low-order stages of the shift register have a predetermined pattern corresponding to the error burst; and said correction module, using the shift information determined by said first comparator, locating and correcting the error burst in the input binary signal in the buffer.

16. The decoder as claimed in claim 15, wherein the shortened cyclic code is a shortened Fire code.

17. The decoder as claimed in claim 15, wherein said first error syndrome register is an error pattern register and said second error syndrome register is an error location register.

18. The decoder as claimed in claim 15, wherein the error burst is a single burst b(x) of a length t or shorter, the cyclic code having generator polynomial of type $G(x)=(x^{2t-1}+1) p(x)$, wherein p(x) is a prime polynomial over GF(2) with period $r_0$, satisfying $r_0>(n-b)$, where n equals a length of a binary code and b equals a number shortened bits.

19. The decoder as claimed in claim 15, wherein the shortened number of zero bits is equal to $(r_0-N+1)$ where $r_0$ is the period of the second factor of the given shortened cyclic code on which the second error syndrome register is based, and N is the length of the shortened cyclic code.

20. The decoder as claimed in claim 15, wherein the number of shifts executed to trap the error burst is no more than (2t−2) shifts.

21. The decoder as claimed in claim 15, wherein the number of shifts and compare operations executed to trap the error burst location in the input binary signal is no more than (N+c) shift and compare operations.

22. The decoder as claimed in claim 15, executed in a signal processor.

23. The decoder as claimed in claim 22, wherein said second error syndrome shift register shifts the shortened zero bits in a manner exploiting the architecture of the signal processor.

24. The decoder as claimed in claim 23, wherein a shift operation is executed in a single signal processor instruction cycle.

25. The decoder as claimed in claim 15, used in a TDMA-based GSM system.

26. The decoder as claimed in claim 25, executed in a signal processor, wherein signal processor resources available during inactive time slots are utilized in a background mode to process the shifting-in of the shortened number of zero bits.

27. The decoder as claimed in claim 26, wherein processing is distributed over a variable number of inactive radio channel time slots in order to provide enough signal processor resources to correct a frame of data while minimizing frame buffering delays.

28. The decoder as claimed in claim 15, wherein error bursts are detected and corrected in real-time.

29. An apparatus for correcting an error burst in a communication system using shortened cyclic codes, comprising:
   means for loading data into a first error syndrome register and a second error syndrome register;
   means for shifting shortened zero bits into the second error syndrome register;
   means for shifting a first number of zero bits into the first error syndrome register to trap an error burst pattern associated with an error burst in the data;
   means for determining a second number of zero bit shifts into the second error syndrome register to trap the error burst location in the data; and
   means for locating and correcting the error burst in the data by using the second number of zero bit shifts and the error burst pattern.

30. The apparatus as claimed in claim 29, wherein the shortened cyclic code is a shortened Fire code.

31. The apparatus as claimed in claim 29, wherein the first error syndrome register is an error pattern register and the second error syndrome register is an error location register.

32. The apparatus as claimed in claim 29, wherein the number of shortened zero bits shifted into the second error syndrome register is equal to $(r_0-N+1)$ where $r_0$ is the period of the factor of a shortened cyclic code on which the second error syndrome register is based.

33. The apparatus as claimed in claim 29, wherein trapping the error burst pattern uses no more than (2t−2) shifts.

34. The apparatus as claimed in claim 29, wherein trapping the error burst location uses no more than (N+c) shift and compare operations.

35. The apparatus as claimed in claim 29, executed in a signal processor.

36. The apparatus as claimed in claim 35, wherein said means for shifting exploits the architecture of the signal processor.

37. The apparatus as claimed in claim 36, wherein a shift operation is executed in a single signal processor instruction cycle.

38. The apparatus as claimed in claim 29, used in a TDMA-based GSM system.

39. The apparatus as claimed in claim 38, executed in a signal processor, wherein the signal processor resources available during inactive time slots are utilized in a background mode to process the shifting in of the shortened zero bits.

40. The apparatus as claimed in claim 39, wherein processing is distributed over a variable number of inactive radio channel time slots in order to provide enough signal processor resources to correct a frame of data while minimizing frame-buffering delays.

41. The apparatus as claimed in claim 29, wherein the error bursts are detected and corrected in real-time.

42. A computer-readable medium having stored thereon sequences of instructions, the sequences of instructions including instructions, when executed by a digital processor, causes the processor to perform:
   loading data coded with a shortened cyclic code into a first error syndrome register and a second error syndrome register;
   shifting shortened zero bits into the second error syndrome register;
   shifting a first number of zero bits into the first error syndrome register to trap an error burst pattern in the data;
   determining a second number of zero bit shifts into the second error syndrome register to trap an error burst location of the error burst pattern in the data; and
   locating and correcting the error burst pattern in the data by using the second number of zero bit shifts and the error burst pattern.

43. The computer-readable medium as claimed in claim 42, wherein the shortened cyclic code is a shortened Fire code.

44. The computer-readable medium as claimed in claim 42, wherein the first error syndrome register is an error pattern register and the second error syndrome register is an error location register.

45. The computer-readable medium as claimed in claim 42, wherein the number of shortened zero bits are equal to $(r_0-N+1)$, where $r_0$ is the period of the second factor of the shortened cyclic code on which the second error syndrome register is based.

46. The computer-readable medium as claimed in claim 42, wherein trapping the error burst pattern uses no more than (2t−2) shifts.

47. The computer-readable medium as claimed in claim 42, wherein trapping the error burst location uses no more than (N+c) shift and compare operations.

48. The computer-readable medium as claimed in claim 42, wherein the digital processor is a digital signal processor.

49. The computer-readable medium as claimed in claim 48, wherein shifting the zero bits exploits the architecture of the digital signal processor.

50. The computer-readable medium as claimed in claim 49, wherein a shift operation is executed in a single digital signal processor instruction cycle.

51. The computer-readable medium as claimed in claim 42, used in a TDMA-based GSM system.

52. The computer-readable medium as claimed in claim 51, executed in a digital signal processor, wherein the digital processor resources available during inactive time slots are utilized in a background mode to process the shifting-in of the shortened zero bits.

53. The computer-readable medium as claimed in claim 52, wherein processing is distributed over a variable number of inactive radio channel time slots in order to provide enough digital signal processor resources to correct a frame of data while minimizing frame-buffering delays.

54. The computer-readable medium as claimed in claim 42, wherein the error burst is detected and corrected in real-time.

55. A method for correcting error bursts in a communication system using a shortened cyclic code, comprising:

loading data coded with a shortened cyclic code into a first error syndrome register and a second error syndrome register;

shifting shortened zero bits into the second error syndrome register;

shifting a first number of zero bits into the first error syndrome register to trap an error burst pattern in the data;

determining a second number of zero bit shifts into the second error syndrome register to trap an error burst location of the error burst pattern in the data; and locating and correcting the error burst pattern in the data by using the second number of zero bit shifts and the error burst pattern.

56. The method as claimed in claim 55, wherein the shortened cyclic code is a shortened Fire code.

* * * * *